United States Patent [19]

Condon et al.

[11] Patent Number: 5,461,333
[45] Date of Patent: Oct. 24, 1995

[54] MULTI-CHIP MODULES HAVING CHIP-TO-CHIP INTERCONNECTIONS WITH REDUCED SIGNAL VOLTAGE LEVEL AND SWING

[75] Inventors: Joseph H. Condon, Summit; Robert C. Frye, Piscataway; Thaddeus J. Gabara, Murray Hill; King L. Tai, Berkeley Heights; Scott C. Knauer, deceased, late of Mountainside; Carroll H. Knauer, executor, Linwood, all of N.J.

[73] Assignee: AT&T IPM Corp., Coral Gables, Fla.

[21] Appl. No.: 200,986

[22] Filed: Feb. 24, 1994

Related U.S. Application Data

[63] Continuation-in-part of Ser. No. 31,769, Mar. 15, 1993, abandoned.

[51] Int. Cl.$^6$ .................... H03K 17/10; H03K 17/687
[52] U.S. Cl. ................ 327/208; 327/565; 327/333; 326/68
[58] Field of Search .................... 326/102, 103, 326/122, 63, 68, 80, 83; 327/564, 565, 214, 215, 333, 55, 544, 208

[56] References Cited

U.S. PATENT DOCUMENTS

| | | | |
|---|---|---|---|
| 4,827,368 | 5/1989 | Suzuki et al. | 361/88 |
| 4,845,381 | 7/1989 | Cuevas | 307/264 |
| 4,937,653 | 6/1990 | Blonder et al. | 257/739 |
| 5,057,701 | 10/1991 | Miller, Jr. | 307/262 |
| 5,075,581 | 12/1991 | Kamata | 307/475 |
| 5,134,316 | 7/1992 | Ta | 307/475 |
| 5,192,879 | 3/1993 | Aoki et al. | 307/451 |
| 5,233,235 | 8/1993 | Ramacher | 307/303 |

OTHER PUBLICATIONS

Y. Nakagome et al., "Circuit Techniques for 1.5–3.6–V Battery-Operated 64–Mb DRAM," *IEEE Journal of Solid–State Circuits*, vol. 26, No. 7, Jul. 1991, pp. 1003–1009.

M. McConnell et al., "An Experimental 4–Mb Flash EEPROM with Sector Erase," *IEEE Journal of Solid–State Circuits*, vol. 26, No. 4, Apr., 1991, pp. 484–489.

T. Gabara et al., "An I/O CMOS Buffer Set for Silicon Multi Chip Module's (MCM)," *Proc. 1993 IEEE Multi–Chip Module Conference, MCMC 1993*, Mar. 15–18, 1993, Santa Cruz, California, pp. 147–152.

*Primary Examiner*—Timothy P. Callahan
*Assistant Examiner*—Dinh T. Le
*Attorney, Agent, or Firm*—David I. Caplan

[57] ABSTRACT

A multi-chip module is composed of two or more integrated-circuit chips located on a substrate such as a dielectrically coated silicon substrate. The chips are interconnected by means of transmission wiring lines. At least some of the chips contain one or more input buffer circuits, each composed of two branches ("legs"). Each such branch contains, in one embodiment, an n-channel MOS transistor connected in series with a pair of series-connected p-channel MOS transistors—whereby, in each such branch, one of the p-channel MOS transistors is located between (intermediate) the other of the p-channel MOS transistors and the n-channel MOS transistor of that same branch. On the other hand, in each buffer circuit, the intermediate p-channel MOS transistors of both branches are cross-coupled. Each of the n-channel MOS transistors is connected in a common gate configuration to receive one of the complementary input signals coming from the transmission wiring lines, and the other of the p-channel transistors in each branch is connected in a common source configuration to receive the other of the complementary input signals.

13 Claims, 3 Drawing Sheets

MULTI-CHIP MODULES HAVING CHIP-TO-CHIP INTERCONNECTIONS WITH REDUCED SIGNAL VOLTAGE LEVEL AND SWING

CROSS-REFERENCE TO RELATED APPLICATION

This application is a Continuation-In-Part of application Ser. No. 08/031769 filed Mar. 15, 1993, now abandoned which is incorporated herein by reference.

TECHNICAL FIELD

This invention relates to interconnections of two or more semiconductor integrated circuit chips and more particularly to multi-chip modules, that is, a multiplicity of such chips integrated on a substrate such as a dielectrically coated semiconductor substrate.

BACKGROUND OF THE INVENTION

In a multi-chip module, two or more semiconductor integrated circuit chips are located on, and are electrically interconnected by chip-to-chip transmission wires located on, a common substrate. During electrical operation, signals are commonly sent, for example, from output buffers located at the sending (transmitting or output) terminals (pins) of one of the chips, via the chip-to-chip transmission wires (lines), to input buffers located at receiving (or input) terminals (pins) of another one or more of the chips. Each chip is typically electrically powered, among other means, by a pair of voltage sources, VDD and VSS—particularly those portions of the chips devoted to CMOS (complementary metal oxide semiconductor) circuitry.

As used herein, the term "transmission line" refers to any wiring that can transmit a signal from one point to another, regardless of the ratio of the signal velocity to the signal frequency.

A shortcoming of one of the ordinary chip-to-chip interconnection schemes of prior art resides in the presence on the interconnecting lines of undesirably large voltage swings (approximately equal to VDD-VSS), and hence undesirably high power required to drive the lines. Although prior-art level-shifting buffers—such as that shown in FIG. 7 in *IEEE Journal of Solid State Circuits*, Vol. 26, No. 4, at page 488 (April 1991)—could be used to reduce the voltage swings, such buffers would suffer from a reduced speed of response to incoming signals on the lines, and hence would impose an undesirably low limit on the frequency of operation of the integrated circuit chips.

Another approach can be inferred from U.S. Pat. No. 5,075,581, issued to S. Kamata on Dec. 24, 1991. That patent implies, as shown in FIG. 1 herein, input buffer circuitry 20 that receives a pair of complementary signals propagating on a pair of complementary signal transmission lines NAB and CAB from output buffer circuitry 10. The output buffer circuitry 10 is integrated in semiconductor integrated circuit chip A; the input buffer circuitry 20 is integrated in semiconductor integrated circuit chip B.

The input buffer circuitry 20 has two branches ("legs"), each formed by a triplet of series-connected transistors. One of the branches is formed by p-channel MOS transistors MP1 and MP2 connected in series with n-channel MOS transistor MN5; the other of the branches is formed by p-channel MOS transistors MP3 and MP4 connected in series with n-channel MOS transistor MN6. As further shown (FIG. 1 ), the transistors MP2 and MP4 are cross-coupled by means of cross-coupling wires. The gate terminals of MP1 and MN5 are connected to a common input terminal NIB (normal input to chip B); the gate terminals of MP3 and MN6 are connected to another common input terminal CIB (complementary input to chip B). Complementary binary digital outputs equal to VDD and VSS are generated at both (1) a node between transistors MP2 and MN5, and (2) a node between transistors MP4 and MN6—that is to say, at nodes located on the cross-coupling wires. These nodes are connected to input terminals of inverters 21 and 23, respectively. An output terminal of the inverter 21 is connected to an input terminal of the inverter 22. During electrical operation, one or more of the inverters 21, 22, and 23 generate and deliver the binary digital outputs VDD and VSS to interior circuitry (not shown) of the chip B.

To decrease latency, logic gates such as NAND and NOR gates can be used instead of the inverters 21, 22, and 23.

During electrical operation, the substrate of both chips A and B typically are both maintained at VSS=0 (chip ground). A conventional CMOS inverter 11, integrated in the chip A, receives binary digital signal from the interior of this chip A. During electrical operations, this inverter 11 delivers binary digital output signals, equal to VDD and VSS, respectively, to another conventional CMOS inverter 12 integrated in the chip A as well as to the gate terminals of n-channel MOS transistors MN1 and MN4. In response to these output signals, the inverter 12 delivers the binary digital signals, VDD and VSS, to the gate terminals of n-channel MOS transistors MN2 and MN3. The transistors MN1 and MN2 are connected in series between dc power sources VP and VSS and thus form an inverter which, during operation, delivers binary digital outputs VP and VSS; the transistors MN3 and MN4 are likewise connected in series between VP and VSS, and thus also form an inverter which, during operation, generates and delivers binary digital outputs VP and VSS, respectively, to the input buffer circuitry 20.

Typically VDD=5 volt; and typically VP is in the approximate range of 1.5 volt to 2.0 volt. For example, VP is equal to approximately 1.7 volt. In any event, VP is significantly less than VDD and significantly greater than VSS. The inverters 11 and 12, together with the transistors MN1, MN2, MN3, and MN4, form the output buffer circuitry 10. Thus the voltage swings on the complementary transmission lines NAB and CAB are equal to VP-VSS, for example, VP-0=1.7 volt.

More specifically, in the input buffer circuitry 20 a voltage VSS=0 will be applied by the output buffer circuitry 10 to the gate terminal of MN5 in order to turn OFF this transistor, and subsequently a voltage VP of at least 1.7 volt will be applied by the output buffer circuitry 10 in order to turn ON this transistor MN5—whereby a transmission-line voltage swing of 1.7 volt results. It would be desirable to have circuitry in which this swing can be reduced. Any attempts, however, to reduce this swing further—such as by introducing a voltage bias or an n-channel transistor diode into the output buffer circuitry 10 in series with MN1 and MN2, and with MN3 and MN4—would entail undersirable amounts of power dissipation in each and every such output buffer circuitry located on chip A.

SUMMARY OF THE INVENTION

In order to mitigate the shortcomings of prior art, this invention involves input buffer circuitry, responsive to complementary first and second incoming signals on a pair of complementary first and second transmission lines, respectively. In one embodiment the invention involves input buffer circuitry including:

- first and second parallel branches, each of the branches having an n-channel transistor connected in series with first and second p-channel transistors, each of the transistors having a gate, a source, and a drain terminal;
- first electrically conductive means, connecting the gate terminal of the first p-channel transistor in the first branch to the source terminal of the n-channel transistor in the second branch, and connected to receive the first incoming signal;
- second electrically conductive means, connecting the gate terminal of the first p-channel transistor in the second branch to the source terminal of the n-channel transistor in the first branch, respectively, and connected to receive the second incoming signal; and
- third and fourth electrically conductive means, connecting the gate terminal of the second p-channel transistors in the first and second branches to the drain terminal of the n-channel transistor in the second and first branches, respectively, a node of the third or fourth electrically conductive means providing an output terminal of the input buffer circuitry.

In this way the voltage swings on the transmission lines can be reduced further.

Advantageously, all the transistors are MOS transistors, in which case the voltage swings can be reduced to approximately 1.2 volt (instead of 1.7 volt).

It is also advantageous, in one embodiment (FIG. 2), that the input buffer circuitry further include first and second voltage sources, the first voltage source (typically VDD) being connected to the source terminals of the first p-channel transistors in the first and second branches, the second voltage source (FIG. 2: VC) being connected to the gate terminal of the n-channel transistor, respectively, whereby complementary first and second output signals are generated at the drain terminals of the n-channel transistors in the first and second branches, respectively, or simply a single output signal is generated at the output terminal of the input buffer circuitry, whereby each of the complementary incoming first and second signals has a lower signal swing than that of each of the output signals.

Also, this invention can further provide a multi-chip module comprising a pair of first and second integrated circuit chips, the second chip including the input buffer circuitry as aforesaid, and the module further including first and second complementary transmission lines that electrically connect complementary first and second output terminals of the first chip separately with the gate terminal of each of the first p-channel transistors in the first and second branches, respectively, in the second chip.

It is also advantageous that the first chip in the module comprises an output buffer circuitry adapted for developing the complementary first and second input signals, and for delivering the complementary first and second input signals to the first and second output terminals of the first chip.

The purpose of the first p-channel transistors in each branch is to facilitate changing ("flipping") the state of the buffer circuitry, by immediately turning OFF when an incoming signal tends to turn ON the n-channel transistor in that same branch and thus preventing undesirably large currents to flow in that branch.

In another embodiment (FIG. 3), the channel conductivities of all above-mentioned p-channel and n-channel transistors are interchanged: that is to say, all the above-mentioned p-channel transistors are n-channel, while all the above-mentioned n-channel transistors are p-channel.

It is also advantageous that in both embodiments a module be formed comprising first and second integrated circuit chips, the second chip including input buffer circuitry as aforesaid, and the module further including first and second complementary transmission lines that electrically connect complementary first and second output terminals of the first chip separately with the first and second electrically conductive means, respectively, of the second chip. It is also advantageous that the first chip comprises an output buffer circuitry adapted for developing the complementary first and second incoming signals, and for delivering the complementary first and second incoming signals to the first and second output terminals of the first chip.

BRIEF DESCRIPTION OF THE DRAWING(S)

Only for the sake of clarity, none of the drawings is to any scale. Elements that are the same or are similar in different FIGURES are denoted by the same reference labels.

DETAILED DESCRIPTION

Figure 1:
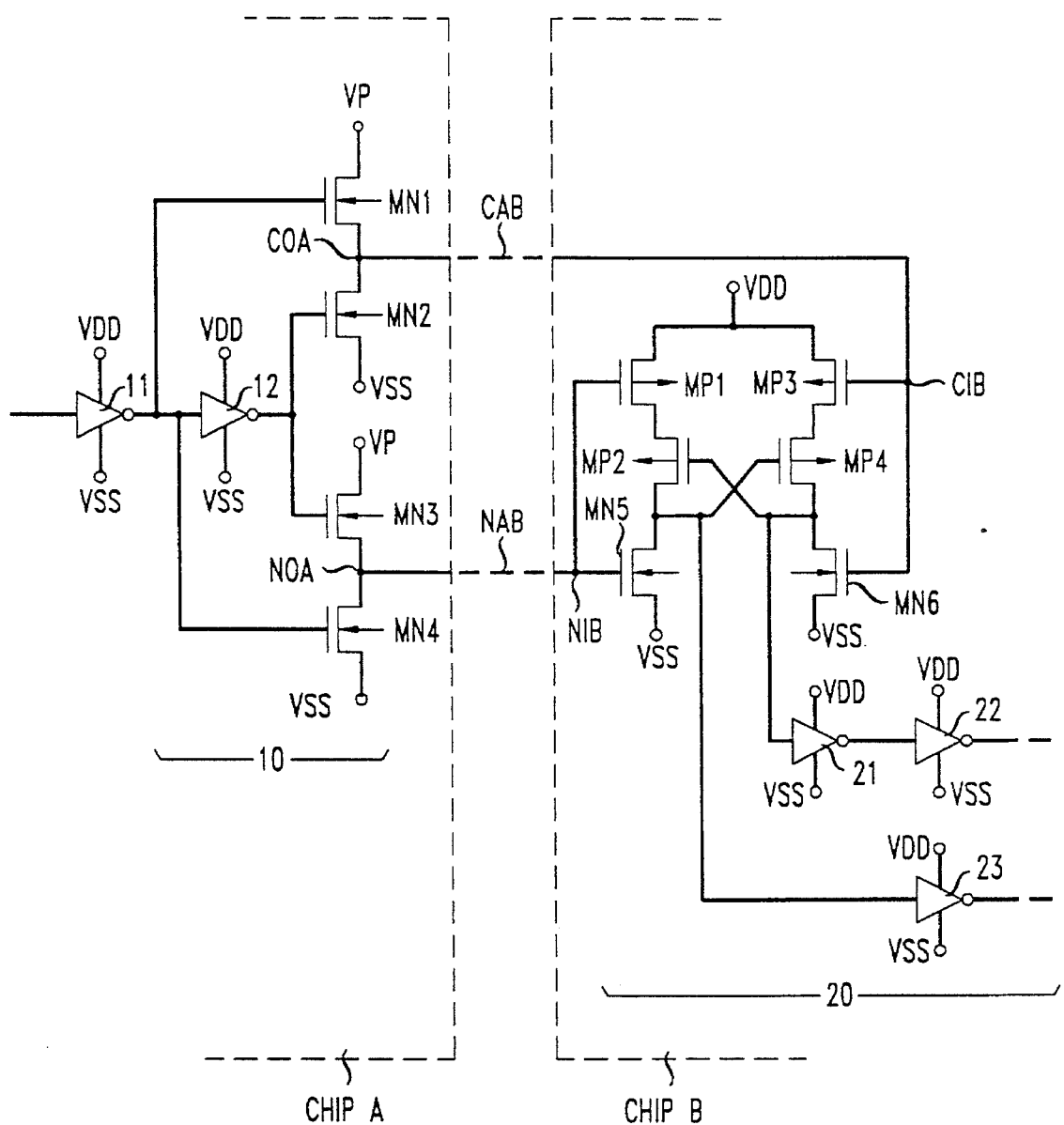
FIG. 1 is a circuit schematic including input buffer circuitry useful in explaining the background of the invention.
Figure 2:
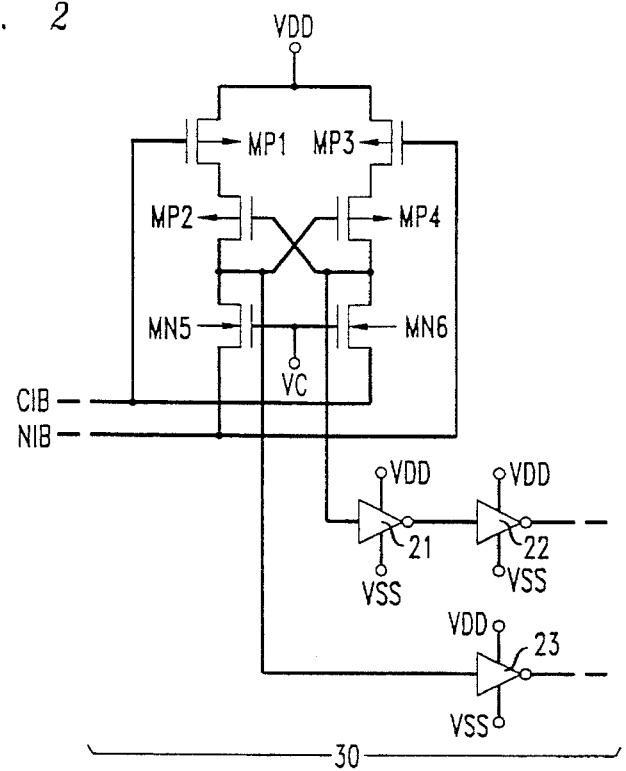
FIG. 2 is a circuit schematic of input buffer circuitry in accordance with a specific embodiment of the invention.

Turning now to FIG. 2, input buffer circuitry 30 is, in accordance with a specific embodiment of the invention, an attractive alternative to the above-described input buffer circuitry 20 (FIG. 1), in order to reduce further the voltage swing (VP-VSS) on complementary transmission lines NIB and CIB (FIG. 2), which are analogous respectively to lines CAB and NAB (FIG. 1). The circuitry 30 (FIG. 2) includes a dc voltage source VC connected to the gate terminals of the n-channel transistors MN5 and MN6, as well as other indicated circuitry connections. The voltage VP is reduced to the approximate range of 1.0 volt to 1.5 volt, for example approximately 1.2 volt, while VSS is maintained at approximately 0.0 volt and VDD at approximately 5 volt. Advantageously, VC is in the approximate range of 1.5 volt to 2.0 volt, typically approximately 1.7 volt. In this way, the voltage swing (VP-VSS) on the complementary transmission lines NIB and CIB can be (further) reduced, for example, to approximately 1.2 volt rather than 1.7 volt in the case of the previously described input buffer circuitry 20 (FIG. 1).

The reason for this (further) reduction in voltage swing in the circuitry configuration shown in FIG. 2 can be seen from the following consideration: If VC=1.7 volt, for example, then when VSS=0 is applied to the source terminal of the n-channel transistor MN5, it is sufficient to turn ON this transistor, for then the gate-source potential=1.7 volt; and when a voltage (VP-VSS) equal to, for example, VP=1.2 volt is applied to the source terminal of MN5, it is sufficient to turn OFF this transistor, for then the gate-source potential=0.5 volt, which is below the threshold voltage of 0.6 volt.

Figure 3:
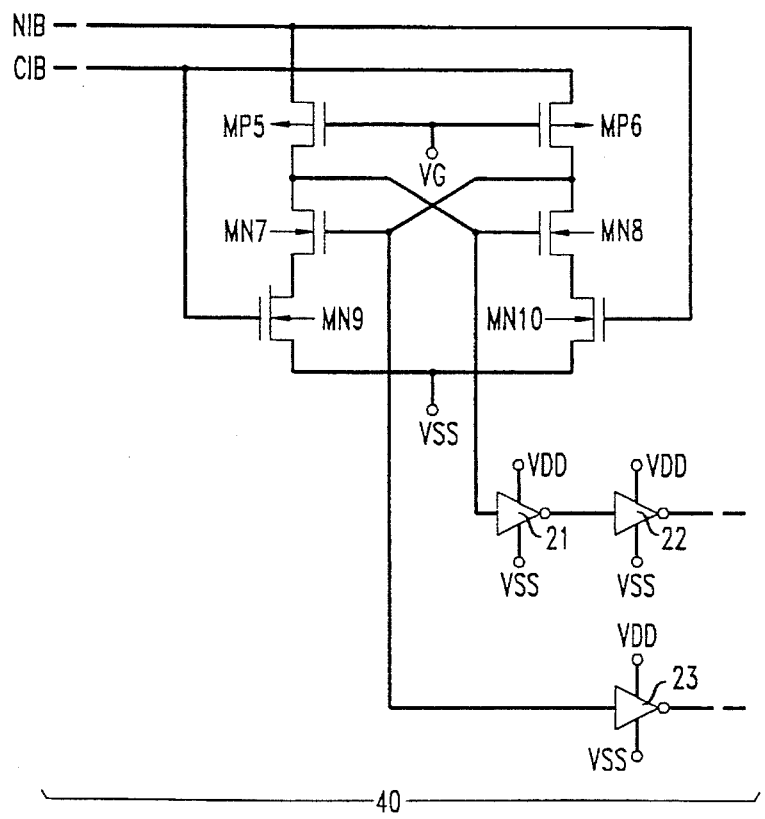
FIG. 3 is a circuit schematic of input buffer circuitry in accordance with another specific embodiment of the invention.

Turning now to FIG. 3, input buffer circuitry 40 is an alternative to the above-described input buffer circuitry 30 (FIG. 2). This circuitry 40 includes a dc voltage source VG connected to the gate terminals of the p-channel MOS transistors MP5 and MP6, as well as the other indicated circuitry connections. Advantageously, VG is in the approximate range of 2.8 volt to 3.3 volt, typically approximately 3.0 volt. At the same time the output buffer circuitry 10 advantageously is modified as follows: (1) the n-channel MOS transistors MN1, MN2, MN3, and MN4 are all replaced with p-channel MOS transistors; (2) the voltage source VSS is replaced with VDD, and the voltage source VDD is replaced with VSS; and VP is in the approximate range of 3.5 volt to 4.0 volt, for example, approximately 3.8 volt. In this way, again the voltage swing (VDD-VP) on the transmission lines NIB and CIB can be (further) reduced, for example, to 1.2 volt.

Figure 4:
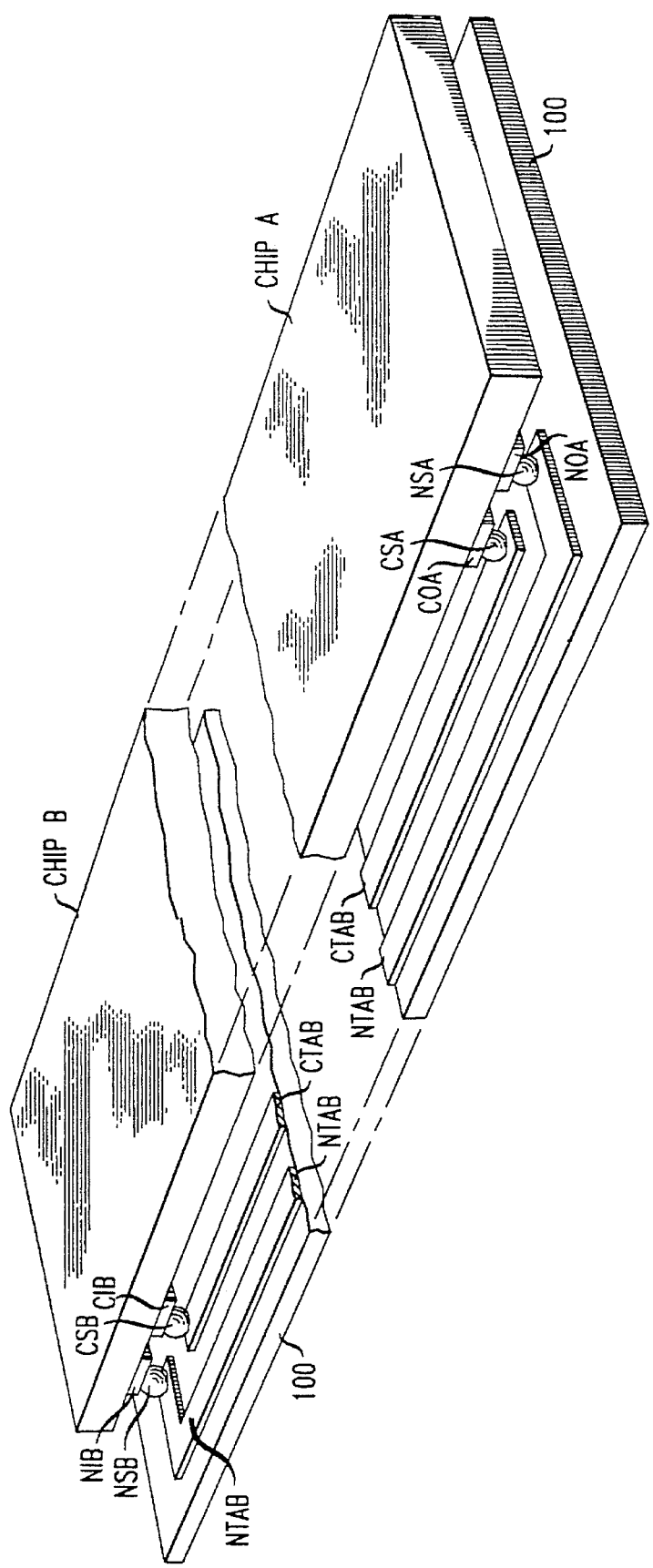
FIG. 4 is a perspective view of a portion of a multi-chip module, useful in explaining principles of the invention.

Referring now to FIG. 4, a multi-chip module comprises a substrate 100, typically silicon having top major surface that is coated with a dielectric layer (not shown), typically comprising silicon dioxide. Complementary transmission lines NTAB and CTAB, which are, for example, respectively lines NAB and CAB shown in FIG. 1, connect the output terminals NOA and COA, respectively, of chip A to the input terminals NIB and CIB of chip B, respectively, through solder bumps NSA and CSA, respectively, and through solder bumps NSB and CSB, respectively. Each of the input and output terminals NIB, CIB and NOA, COA, respectively, typically comprises, in the order of deposition on the top surface of the dielectric layer on the substrate 100: gold, copper, chrome-copper, and chrome; each of the solder bumps typically comprises a lead-tin solder; and the transmission lines NTAB and CTAB typically comprises aluminum.

It should be understood that in FIG. 4 the chips A and B comprise all the circuitry that the chips A and B do in FIGS. 2 or 3 (including buffer and interior circuitry). In this way (typically after encapsulation as known in the art), a multi-chip module is formed by the chips A and B together with the substrate 100.

Although the invention has been described in terms of specific embodiments, various modifications can be made without departing from the scope of the invention. For example, in addition to having further input buffer circuitry each in accordance with the input buffer circuitry 20 or 30, the chip B can have added output buffer circuitry each in accordance with the output buffer circuitry 10; and in addition to having further output buffer circuitry 10, the chip A can have added input buffer circuitry, each in accordance with the input buffer circuitry 20 or 30. At the same time, the substrate 100 would then have additional pairs of complementary complementary transmission lines, each such pair in accordance with NTAB and CTAB.

It is claimed:

1. Input buffer circuitry, responsive to complementary first and second incoming signals, including
   (a) first and second parallel branches, each of the branches having a first transistor of a first channel type connected in series with second and third transistors, both of a second channel type that is opposite from the first channel type, and each of the first, second, and third transistors having a gate terminal, a source terminal, and a drain terminal, the first transistors of the first and second branches being located at an extremity of said branches, respectively;
   (b) first electrically conductive means, connecting the gate terminal of the third transistor in the first branch to the source terminal of the first transistor in the second branch, and connected to receive the first incoming signal;
   (c) second electrically conductive means, electrically connecting the gate terminal of the third transistor in the second branch to the source terminal of the first transistor in the first branch, and connected to receive the second incoming signal; and
   (d) third and fourth electrically conductive means, connecting the gate terminals of the second transistors in the first and second branches to the drain terminals of the first transistors in the second and first branches, respectively, a node for providing an output terminal located on the input buffer circuitry
   e) fifth electrically conductive means connecting the gates of said first transistors to a voltage potential.

2. The input buffer circuitry of claim 1 in which all the transistors of the first channel type are p-channel MOS transistors and in which all the transistors of the second channel type are n-channel MOS transistors.

3. The input buffer circuitry of claim 2 further including first and second voltage sources, the first voltage source being connected to the source terminal of each of the third transistors in the first and second branches, the second voltage source being connected to the gate terminal of each of the first transistors in both the first and the second branches, whereby in response to the complementary first and second input signals, an output signal is generated at the output terminal of the input buffer circuitry such that each of the complementary first and second incoming signals has a signal level that is less than that of the output signal.

4. A module comprising first and second integrated circuit chips, the second chip including input buffer circuitry in accordance with claim 3, and the module further including first and second transmission lines that electrically connect complementary first and second output terminals of the first chip separately with the first and second electrically conductive means, respectively, of the second chip.

5. The module of claim 4 in which the first chip comprises: an output buffer circuitry for developing the complementary first and second incoming signals, and for delivering the complementary first and second incoming signals to the first and second output terminals of the first chip.

6. A module comprising first and second integrated circuit chips, the second chip including input buffer circuitry in accordance with claim 2, and the module further including first and second transmission lines that electrically connect complementary first and second output terminals of the first chip separately with the first and second electrically conductive means, respectively, in the second chip.

7. The module of claim 6 in which the first chip comprises:
   an output buffer circuitry for developing the complementary first and second input signals, and for delivering the complementary first and second input signals to the first and second output terminals of the first chip.

8. The input buffer circuitry of claim 1 in which all the transistors of the first channel type are n-channel MOS transistors and in which all the transistors of the second channel type are p-channel MOS transistors.

9. The input buffer circuitry of claim 8 further including first and second voltage sources, the first voltage source being connected to the source terminal of each of the third transistors in both the first and the second branches, the second voltage source being connected to the gate terminal of each of the first transistors, in the first and second branches, whereby in response to the complementary first and second input signals, an output signal is generated at the output terminal of the input buffer circuitry such that each of the complementary first and second incoming signals has a signal level that is less than that of the output signal.

10. A module comprising first and second integrated circuit chips, the second chip including input buffer circuitry in accordance with claim 9, and the module further including first and second transmission lines that electrically connect complementary first and second output terminals of the first chip separately with the first and second electrically conductive means, respectively, of the second chip.

11. The module of claim 10 in which the first chip comprises:
   an output buffer circuitry adapted for developing the complementary first and second incoming signals, and for delivering the complementary first and second incoming signals to the first and second output terminals of the first chip.

12. A module comprising first and second integrated circuit chips, the second chip including input buffer circuitry in accordance with claim 8, and the module further including first and second transmission lines that electrically connect complementary first and second output terminals of the first chip separately with the first and second electrically conductive means, respectively, in the second chip.

13. The module of claim 12 in which the first chip comprises:
   an output buffer circuitry for developing the complementary first and second input signals, and for delivering the complementary first and second input signals to the first and second output terminals of the first chip.

* * * * *